United States Patent
Lhee et al.

(10) Patent No.: US 8,716,931 B2
(45) Date of Patent: May 6, 2014

(54) ORGANIC LIGHT EMITTING DIODE (OLED) DISPLAY

(75) Inventors: Zail Lhee, Yongin (KR); Chi-Wook An, Yongin (KR); Hee-Seong Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 12/836,386

(22) Filed: Jul. 14, 2010

(65) Prior Publication Data

US 2011/0215302 A1    Sep. 8, 2011

(30) Foreign Application Priority Data

Mar. 5, 2010    (KR) .................. 10-2010-0020100

(51) Int. Cl.
   *H01L 51/52*    (2006.01)
(52) U.S. Cl.
   USPC ........................................ 313/512; 313/504
(58) Field of Classification Search
   USPC ................................. 313/498–512
   See application file for complete search history.

(56) References Cited

U.S. PATENT DOCUMENTS

| | | | |
|---|---|---|---|
| 2002/0190257 A1* | 12/2002 | Yamazaki et al. | 257/72 |
| 2003/0230972 A1 | 12/2003 | Cok | |
| 2005/0067954 A1* | 3/2005 | Nishikawa et al. | 313/506 |
| 2005/0194896 A1* | 9/2005 | Sugita et al. | 313/506 |
| 2005/0275343 A1* | 12/2005 | Tanaka et al. | 313/504 |
| 2006/0071592 A1* | 4/2006 | Narasimhan et al. | 313/506 |
| 2006/0113552 A1* | 6/2006 | Song et al. | 257/88 |
| 2007/0114925 A1* | 5/2007 | Cok | 313/512 |
| 2007/0222372 A1* | 9/2007 | Cok et al. | 313/504 |
| 2008/0018239 A1 | 1/2008 | Matsuda et al. | |

FOREIGN PATENT DOCUMENTS

| | | |
|---|---|---|
| JP | 2001-230072 | 8/2001 |
| JP | 2005-174743 | 6/2005 |
| JP | 2005-197009 | 7/2005 |
| JP | 2005-197010 | 7/2005 |
| JP | 2005-197011 | 7/2005 |
| JP | 2006-302506 | 11/2006 |
| JP | 2007-115626 | 5/2007 |
| KR | 1020050021967 | 3/2005 |
| KR | 1020060055054 | 5/2006 |
| KR | 10-2008-0018799 | 2/2008 |
| KR | 10-0829750 B1 | 5/2008 |

* cited by examiner

*Primary Examiner* — Karabi Guharay
(74) *Attorney, Agent, or Firm* — Christie, Parker & Hale, LLP (57) ABSTRACT

An organic light emitting diode display includes a substrate main body; an organic light emitting element on the substrate main body; an encapsulation substrate covering the organic light emitting element and coupled to the substrate main body; a translucent insulating layer filter formed on the encapsulation substrate; and a microcavity between the translucent insulating layer filter and the encapsulation substrate.

10 Claims, 6 Drawing Sheets

ORGANIC LIGHT EMITTING DIODE (OLED) DISPLAY

CROSS-REFERENCE TO RELATED APPLICATION

This application claims priority to and the benefit of Korean Patent Application No. 10-2010-0020100 filed in the Korean Intellectual Property Office on Mar. 5, 2010, the entire content of which is incorporated herein by reference.

BACKGROUND

1. Field

The following description relates generally to an organic light emitting diode (OLED) display. More particularly, it relates to generally to an organic light emitting diode (OLED) display with reduced defects.

2. Description of Related Art

An organic light emitting diode (OLED) display is a self emissive display device that displays images with organic light emitting diodes. The OLED display differs from a liquid crystal display (LCD) in that it does not require a separate light source and typically is thinner and lighter than a comparable LCD. Further, the OLED display has desirable characteristics such as low power consumption, high luminance, and high reaction speed, and is gaining more and more attention as a next-generation display device for portable electronic devices.

The OLED usually includes a hole injection electrode, an organic emission layer, and an electron injection electrode. The OLED emits light by energy that is generated when excitons (which are formed by coupling of holes that are received from the hole injection electrode and electrons that are received from the electron injection electrode) within the organic emission layer drop to a ground state.

In order to improve light efficiency by effectively extracting light generated from the organic emission layer, a microcavity effect has been used. The microcavity effect uses a theory that light is iteratively reflected by a reflection layer (e.g., a lower electrode layer) and a transflective layer (e.g., an upper electrode layer) that have a predetermined gap (e.g., an optical path length) therebetween, and a strong interference effect occurs between the iteratively reflected light such that light having a specific wavelength is amplified and light having other wavelengths is offset. Accordingly, color reproducibility and luminance are improved.

However, the reflection layer (the lower electrode) and the transflective layer (the upper electrode layer) generating the resonance have different effective lengths. To compensate for the differences of the effective lengths, a red pixel includes a red emission layer and a red assistance layer, and a green pixel includes a green emission layer and a green assistance layer. Accordingly, when forming the organic emission layer in each pixel, a fine metal mask to deposit each color of the corresponding pixel is required. By the formation of the red assistance layer and the green assistance layer, the number of uses of the fine metal mask is increased. In addition, a blue pixel includes a blue emission layer, and a blue assistance layer may be used for the blue pixel. As the number of uses of the fine metal mask is increased, stain defects and black spots are generated such that the process yield may be deteriorated. Accordingly, there is a need to reduce the number of uses of the fine metal mask.

The above information disclosed in this Background section is only for enhancement of understanding of the background of the described technology and therefore it may contain information that does not form the prior art that is already known in this country to a person of ordinary skill in the art.

SUMMARY

An aspect of an embodiment of the present invention is directed toward an organic light emitting diode (OLED) display with reduced defects due to the use of a fine metal mask.

An OLED display according to an exemplary embodiment includes: a substrate main body; an organic light emitting element on the substrate main body; an encapsulation substrate covering the organic light emitting element and coupled to the substrate main body; a translucent insulating layer filter on the encapsulation substrate; and a microcavity between the translucent insulating layer filter and the encapsulation substrate.

The translucent insulating layer filter may be on at least one of an inner surface and an outer surface of the encapsulation substrate. The inner surface of the encapsulation substrate is the surface facing the organic light emitting element. The outer surface of the encapsulation substrate is the surface facing away from the organic light emitting element.

The translucent insulating layer filter may include separate patterned portions corresponding to a red pixel portion, a green pixel portion, and a blue pixel portion of the organic light emitting element. The translucent insulating layer filter may include a plurality of layers, a separate microcavity being present at each interface of adjacent layers.

The translucent insulating layer filter may include a first translucent insulating layer filter on the inner surface of the encapsulation substrate, and a second translucent insulating layer filter on the outer surface of the encapsulation substrate. The first translucent insulating layer filter may include separate patterned portions corresponding to a red pixel portion, a green pixel portion, and a blue pixel portion of the organic light emitting element, and the second translucent insulating layer filter may be a continuous layer corresponding to the total of the red pixel portion, the green pixel portion, and the blue pixel portion of the organic light emitting element. The first translucent insulating layer may include a plurality of layers, a separate microcavity being present at each interface of adjacent layers.

The first translucent insulating layer filter be a continuous layer corresponding to the total of the red pixel portion, the green pixel portion, and the blue pixel portion of the organic light emitting element, and the second translucent insulating filter layer may include separate patterned portions corresponding to a red pixel portion, a green pixel portion, and a blue pixel portion of the organic light emitting element. The second translucent insulating layer may include a plurality of layers, a separate microcavity being present at each interface of adjacent layers.

The translucent insulating layer filter may be formed of an organic insulating material. The translucent insulating layer filter may be formed of a compound selected from the group consisting of silicon oxide, silicon nitride, and silicon oxynitride.

The translucent insulating layer filter may include a plurality of layers. At least one of the plurality of layers may be made of an organic insulating material, and at least one other layer may be formed of a compound selected from the group consisting of silicon oxide, silicon nitride, and silicon oxynitride.

According to an exemplary embodiment, the translucent insulating layer filter is provided on the encapsulation substrate, forming a microcavity, and as a result, the luminance may be improved. That is, the light efficiency of the OLED display may be improved.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Furthermore, with exemplary embodiments, detailed description is given for the constituent elements in the first exemplary embodiment with reference to the relevant drawings, while only different constituent elements from those related to the first exemplary embodiment are described in other exemplary embodiments.

Furthermore, as the size and thickness of the respective structural components shown in the drawings are arbitrarily illustrated for explanatory convenience, the present invention is not necessarily limited to the illustrated sizes and thicknesses. It will be understood that when an element such as a layer, film, region, or substrate is referred to as being "on" another element, it can be directly on the other element or one or more intervening elements may also be present therebetween, unless otherwise specified.

Figure 1:
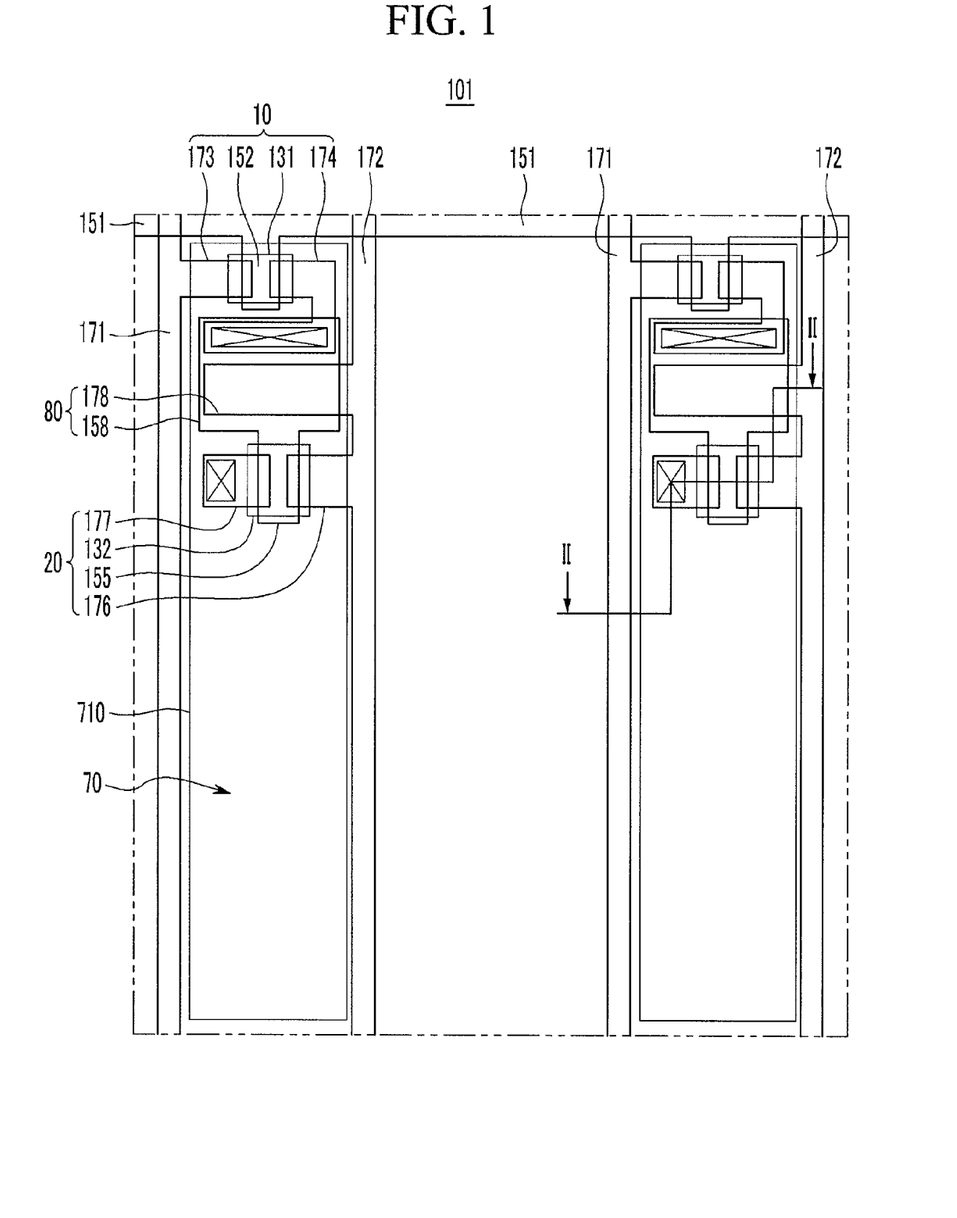
FIG. 1 is a layout view of a pixel of an organic light emitting diode (OLED) display according to a first exemplary embodiment.
Figure 2:
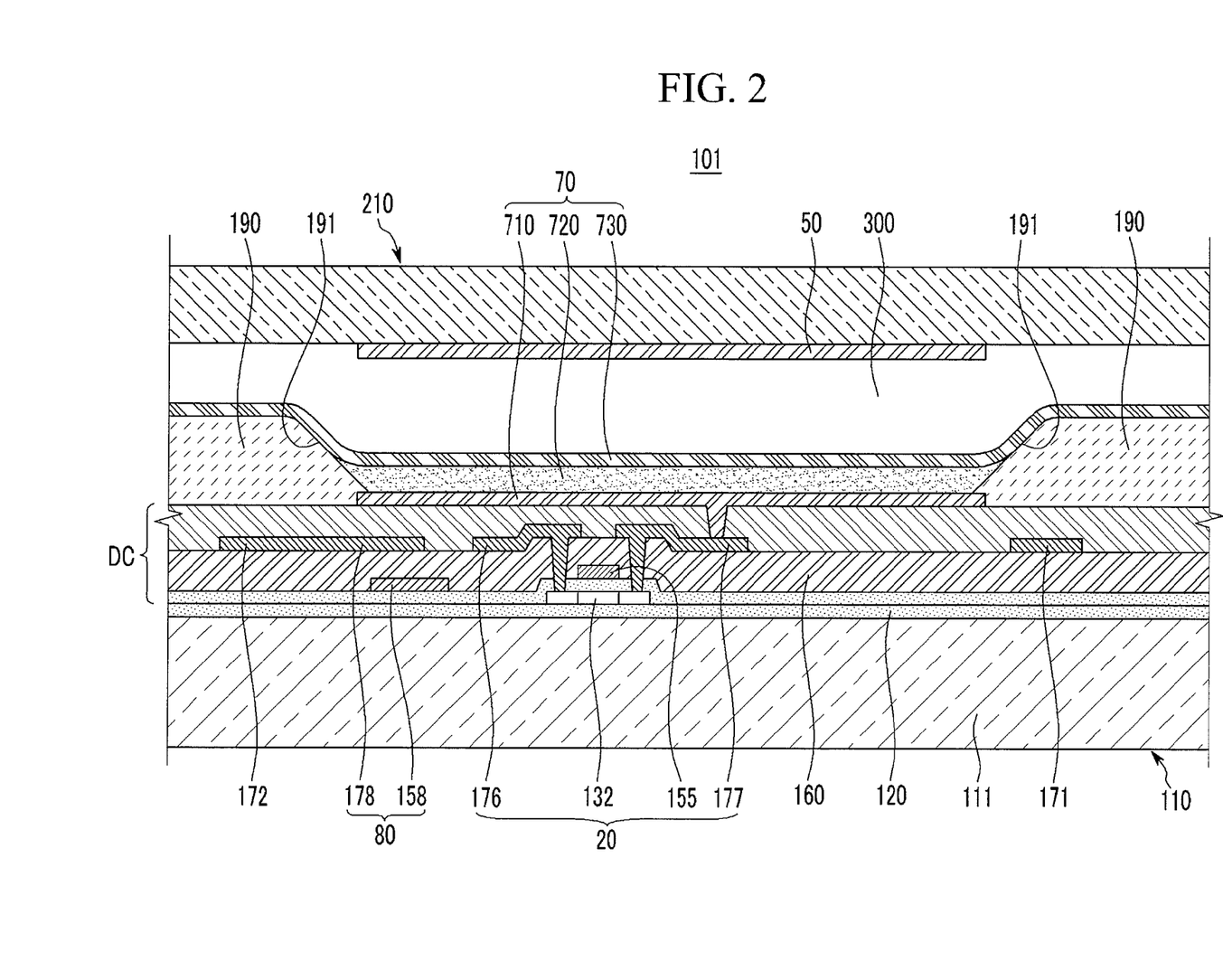
FIG. 2 is a cross-sectional view taken along a line II-II of FIG. 1.

FIG. 1 a layout view of a pixel of an organic light emitting diode (OLED) display according to a first exemplary embodiment, and FIG. 2 is a cross-sectional view taken along a line II-II of FIG. 1. Referring to FIG. 1 and FIG. 2, an OLED display 101 according to the first exemplary embodiment includes a substrate main body 111, a driving circuit DC, an organic light emitting element 70, an encapsulation substrate 210, and a translucent insulating layer filter 50. The OLED display 101 may further include a buffer layer 120 and a pixel definition layer 190.

The substrate main body 111 may be formed of an insulating substrate made of glass, quartz, ceramic, and/or plastic. However, the exemplary embodiment is not limited thereto. That is, the substrate main body 111 may be a metallic substrate made of, for instance, stainless steel.

The buffer layer 120 is disposed on the substrate main body 111. In addition, the buffer layer 120 may be formed of at least one of various inorganic and organic layers. The buffer layer 120 blocks or prevents penetration of impurities, for instance, elemental impurities and/or moisture, to the driving circuit DC and the organic light emitting element 70, and simultaneously planarizes the surface. However, the buffer layer 120 is not a necessary element, and thus it may be omitted according to the type and process conditions of the substrate main body 111.

The driving circuit DC is formed on the buffer layer 120. The driving circuit DC includes a plurality of thin film transistors 10 and 20, and drives the organic light emitting element 70. That is, the organic light emitting element 70 emits light according to a driving signal transmitted from the driving circuit DC to display an image.

The organic light emitting element 70 emits light according to a driving signal transmitted from the driving circuit DC. In addition, the organic light emitting element 70 includes a first electrode 710, which is an anode, injecting holes, a second electrode 730, which is a cathode, injecting electrons, and an organic emission layer 720 disposed between the first and second electrodes 710 and 730. That is, the first electrode 710, the organic emission layer 720, and the second electrode 730 are sequentially stacked such that the organic light emitting element 70 is formed. However, the first exemplary embodiment is not limited thereto. Therefore, for instance, the first electrode 710 may function as the cathode, and the second electrode 730 may function as the anode.

In the first exemplary embodiment, the first electrode 710 forms a reflective layer, and the second electrode 730 forms a transflective layer. Thus, light emitted from the organic emission layer 720 is passed through the second electrode 730 and then emitted. That is, the OLED display 101 according to the first exemplary embodiment is a front emission type.

The reflective layer and the transflective layer may be formed using magnesium (Mg), silver (Ag), gold (Au), calcium (Ca), lithium (Li), chromium (Cr), aluminum (Al), or an alloy thereof. In this case, the reflective layer and the transflective layer are defined by their thicknesses. Generally, the transflective layer has a thickness of less than 200 nm. Light transmittance of the transflective layer is increased as the thickness thereof is decreased, and it is decreased as the thickness thereof is increased.

In addition, the first electrode 710 may further include a transparent conductive layer. That is, the first electrode 710 may have a multi-layered structure including a reflective layer and the transparent conductive layer. The transparent conductive layer of the first electrode 710 may be interposed between the reflective layer and the organic emission layer 720. In addition, the first electrode 710 may have a triple-layered structure with a transparent conductive layer, a reflective layer, and a transparent conductive layer stacked sequentially.

The transparent conductive layer is made of a material such as indium tin oxide (ITO), indium zinc oxide (IZO), zinc oxide (ZnO), or indium oxide ($In_2O_3$). The transparent conductive layer has a relatively high work function. Therefore, when the first electrode 710 includes the transparent conductive layer, smooth hole injection can be performed through the first electrode 710.

The second electrode 730 may be formed of a transparent conductive layer. In the case that the second electrode 730 is made of the transparent conductive layer, the second electrode 730 may be the anode, and thus may inject the holes. Here, the first electrode 710 may be made of the cathode formed of only the reflective layer.

The organic emission layer 720 includes the emission layer, and is a multi-layered structure including at least one of a hole injection layer (HIL), a hole transport layer (HTL), an electron transport layer (ETL), and an electron injection layer (EIL). The layers other than the emission layer among the layers forming the organic emission layer 720 may be omitted as necessary. If the organic emission layer 720 includes all the layers, the hole injection layer (HIL) is disposed on the first electrode, which is the anode, and the hole transport layer (HTL), the emissive layer, the electron transport layer (ETL), and the electron injection layer (EIL) are sequentially disposed thereon. In addition, the organic emission layer 720 may include other layers as necessary.

The pixel definition layer 190 has an opening 191 that is opened toward the encapsulation substrate 210. The opening 191 of the pixel definition layer 190 exposes a portion of the first electrode 710. In the opening 191 of the pixel definition layer 190, the first electrode 710, the organic emission layer 720, and the second electrode 730 are sequentially deposited. The second electrode 730 is further formed on the pixel definition layer 190 as well as the organic emission layer 720. The other layers, except for the emission layer among the organic emission layer 720, may be disposed between the pixel definition layer 190 and the second electrode 730. The organic light emitting element 70 emits the light in the organic emission layer 720 disposed inside the opening 191 of the pixel definition layer 190. That is, the opening 191 of the pixel definition layer 190 defines the light emitting region.

An encapsulation substrate 210 is formed of an insulating substrate made of glass, quartz, ceramic, and/or plastic. The encapsulation substrate 210 is combined (or coupled) and sealed to the substrate main body 111, thereby covering the organic light emitting element 70. The encapsulation substrate 210 and the organic light emitting element 70 are separated from each other. The space between the encapsulation substrate 210 and the substrate main body 111 is sealed by a sealant. An air layer 300 is formed in the space between the encapsulation substrate 210 and the organic light emitting element 70.

The translucent insulating layer filter 50 is formed on the encapsulation substrate 210 thereby forming a microcavity with the encapsulation substrate 210. The translucent insulating layer filter 50 is disposed on the organic light emitting element 70 thereby increasing a light extraction ratio that is emitted from the organic emission layer 720 such that the light efficiency of the OLED display 101 may be improved.

The translucent insulating layer filter 50 is not distinguished per the red, the green, and the blue pixel portions of which the organic light emitting element 70 is made. In other words, the material for the translucent insulating layer filter 50 may be the same regardless of the pixel. The translucent insulating filter layer 50 is formed on the encapsulation substrate 210 thereby forming a microcavity.

Use of the translucent insulating layer filter 50 eliminates the need for the conventional red assistance layer and green assistance layer that were respectively formed in the red pixel and the green pixel. Accordingly, the inclusion of a translucent insulating layer filter 50 reduces the number of uses of the fine metal mask, thereby improving the process yield.

The translucent insulating layer filter 50 may be selectively formed on the inner surface or the outer surface of the encapsulation substrate 210, and may be formed on both the outer and inner surfaces of the encapsulation substrate 210. As used herein, the inner surface of the encapsulation substrate 210 is the surface facing the organic light emitting element 70, and the outer surface of the encapsulation substrate 210 is the surface facing away from the light emitting element 70. The translucent insulating layer filter 50 may be formed with an independent pattern to correspond to each of the red pixel, the green pixel, and the blue pixel of the organic light emitting element 70, or, the translucent insulating layer filter 50 may be a continuous layer corresponding to the total of the red, the green, and the blue pixel portions. Also, the translucent insulating layer filter 50 may be formed of a single layer, or it may be formed of a plurality of layers.

Figure 3:
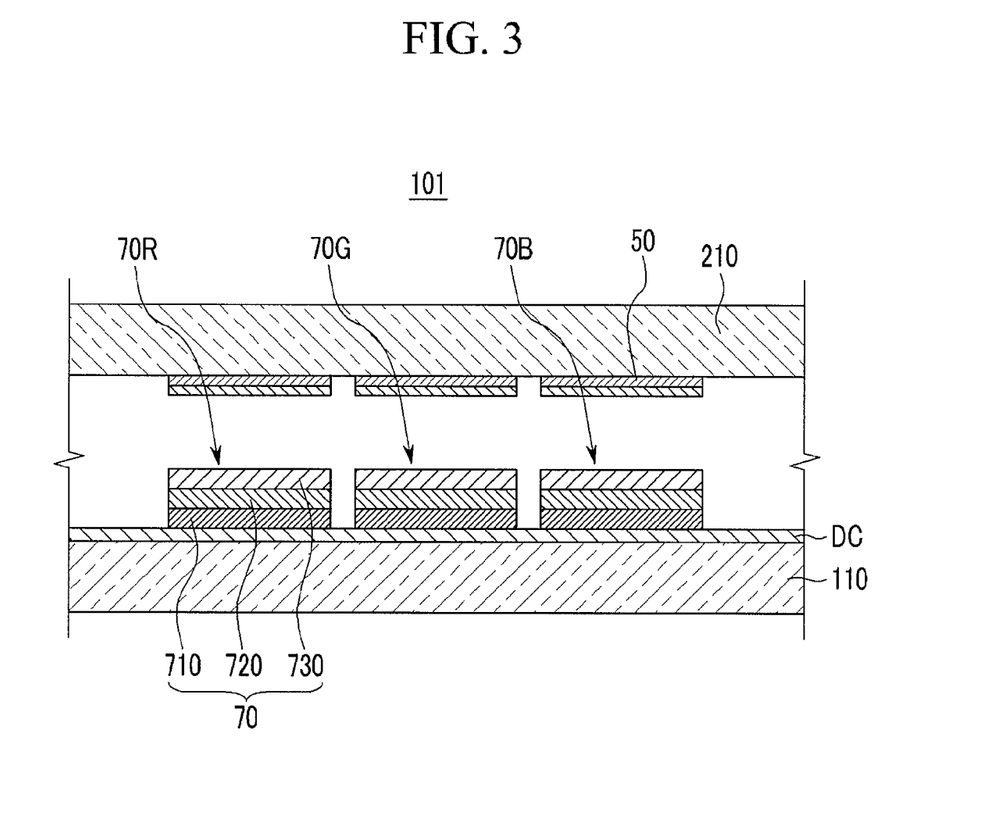
FIG. 3 is a cross-sectional view of red, green, and blue pixel portions of FIG. 2.

FIG. 3 is a cross-sectional view of the red 70R, the green 70G, and the blue 70B pixel portions of FIG. 2. Referring to FIG. 3, the translucent insulating layer filter 50 is formed on the inner surface of the encapsulation substrate 210 with an independent pattern to correspond to each of the red, the green, and the blue pixel portions 70R, 70G, and 70B. In other words, the translucent insulating layer filter 50 has separate portions, each of which correspond to a corresponding one of the red, the green, and the blue pixel portions 70R, 70G, and 70B.

Due to the refractive index between the translucent insulating layer filter 50 and the encapsulation substrate 210, a portion of the light emitted in the organic light emitting element 70 transmits through the translucent insulating layer filter 50, and a remaining portion is reflected by the translucent insulating layer filter 50. In more detail, the light is reflected at the interface of the air layer 300 and the translucent insulating layer filter 50, and the interface of the translucent insulating layer filter 50 and the encapsulation substrate 210.

The light emitted from the organic emission layer 70 is firstly reflected by the first electrode 710 or the second electrode 730, and is emitted into the air layer 300, and is repeatedly reflected and amplified at the translucent insulating layer filter 50.

The translucent insulating layer filter 50 of FIG. 3 is made of a plurality of layers. Light emitted from the organic light emitting element 70 may be iteratively reflected and amplified in the translucent insulating layer filter 50. That is, the light is iteratively reflected at the interface of the air layer 300 and the translucent insulating layer filter 50, the interface of the translucent insulating layer filter 50 and the encapsulation substrate 210, and the interface of each of the layers of the translucent insulating layer filter 50. Through the microcavity, the OLED display 101 effectively amplifies the light, thereby improving the light efficiency.

Further, the light may reflected at an interface of the translucent insulating layer filter 50 and the encapsulation substrate 210 due to a refractive index difference thereof, so it is preferable that the translucent insulating layer filter 50 and the encapsulation substrate 210 have an appropriate refractive index difference. Further, the air layer 300 contacting the translucent insulating layer filter 50 is regarded as a low refraction material, having a refractive index of about 1. Accordingly, each of the translucent insulating layer filter 50 and the encapsulation substrate 210 may have a refractive index derived from the characteristics of the material that is used for manufacturing each of the translucent insulating layer filter 50 and the encapsulation substrate 210.

The translucent insulating layer filter 50 may be formed of an organic insulating material. For example, the organic insulating material may include poly(3,4-ethylenedioxythiophene) (PEDOT); 4,4'-bis[N-(3-methylphenyl-N-phenyl amino)]biphenyl (TPD); 4,4',4"-tris[(3-methylphenyl) phenyl amino]triphenylamine (m-MTDATA); 1,3,5-tris[N,N-bis(2-methylphenyl-amino]-benzene (o-MTDAB); 1,3,5-tris[N,N-bis(3-methylphenyl-amino]-benzene (m-MTDAB); 1,3,5-tris[N,N-bis(4-methylphenyl)-amino]-benzene (p-MTDAB); 4,4'-bis[N,N-bis(3-methylphenyl)-amino]-diphenylmethane (BPPM); 4,4'-dicarbazolyl-1,1'-biphenyl (CBP); 4,4',4"-tris(N-carbazol)triphenylamine (TCTA); 2,2', 2"-(1,3,5-benzentolyl)tris-1-[phenyl-1H-benzoimidazol] (TPBI); and 3-(4-biphenyl)-4-phenyl-5-t-butylphenyl-1,2,4-triazole (TAZ).

The translucent insulating layer filter 50 may also be formed of silicon oxide ($SiO_2$), silicon nitride (SixNy), and/or silicon oxy-nitride (SiOxNy). When the translucent insulating layer filter 50 is formed of the plurality of layers, at least one layer may be formed of the organic insulating material, and at least another layer may be formed of silicon oxide ($SiO_2$), silicon nitride (SixNy), and/or silicon oxy-nitride (SiOxNy).

The structure of the driving circuit DC and the organic light emitting element 70 will be described in more detail. Referring again to FIG. 1 and FIG. 2, although an active matrix (AM) type of OLED display having a 2Tr-1Cap structure in which one pixel includes two thin film transistors (TFTs) 10 and 20 and one storage capacitor 80 is shown, the first embodiment is not limited thereto. Accordingly, the OLED display 101 may be provided with three or more thin film transistors and two or more storage capacitors in one pixel, and may be configured to have various suitable structures with additional wires as necessary. Herein, the pixel represents a minimum unit for displaying an image, and the OLED display 101 displays images through multiple pixels.

A switching thin film transistor 10, a driving thin film transistor 20, a storage capacitor 80, and an organic light emitting element 70 are formed for each pixel. Here, the switching thin film transistor 10, the driving thin film transistor 20, and the storage capacitor 80 form the driving circuit DC. In addition, the display substrate 110 further includes a gate line 151 disposed in one direction, a data line 171 insulatively crossing the gate line 151, and a common power supply line 172. A boundary of one pixel may be defined by the gate line 151, the data line 171, and the common power supply line 172, but it is not limited thereto.

The organic light emitting element 70 includes the first electrode 710, the organic emission layer 720 formed on the first electrode 710, and the second electrode 730 formed on the organic emission layer 720. Holes and electrons are injected into the organic emission layer 720 from the first electrode 710 and the second electrode 730, respectively. When excitons, generated by combination of the injected holes and electrons, in the organic emission layer are transitioned from an excited state to a ground state, light is emitted.

The storage capacitor 80 includes a pair of capacitor plates 158 and 178 with an interlayer insulating layer 160 interposed therebetween. Herein, the interlayer insulating layer 160 functions as a dielectric. Storage capacity is determined by electric charges stored in the storage capacitor 80 and a voltage difference between the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 serves as a switching element that selects a desired pixel to emit light. The switching gate electrode 152 is connected to the gate line 151. The switching source electrode 173 is connected to the data line 171. The switching drain electrode 174 is disposed away from the switching source electrode 173 and connected to either capacitor plate (158 in this case).

The driving thin film transistor 20 applies driving power to the first electrode 710 to allow the organic emission layer 720 of the organic light emitting element 70 to emit light in the selected pixel. The driving gate electrode 155 is connected to the capacitor plate 158, which is connected with the switching drain electrode 174. Each of the driving source electrode 176 and the other capacitor plate 178 are connected to the common power supply line 172. The driving drain electrode 177 is connected to the first (pixel) electrode 710 of the organic light emitting element 70 through a contact hole.

By this structure, the switching thin film transistor 10 is operated by a gate voltage applied to the gate line 151 which transmits a data voltage applied to the data line 171 to the driving thin film transistor 20. A voltage corresponding to a difference between a common voltage applied to the driving thin film transistor 20 from the common power supply line 172 and the data voltage transmitted from the switching thin film transistor 10 is stored in the storage capacitor 80, and a current corresponding to the voltage stored in the storage capacitor 80 flows to the organic light emitting element 70 through the driving thin film transistor 20 to allow the organic light emitting element 70 to emit light.

Figure 4:
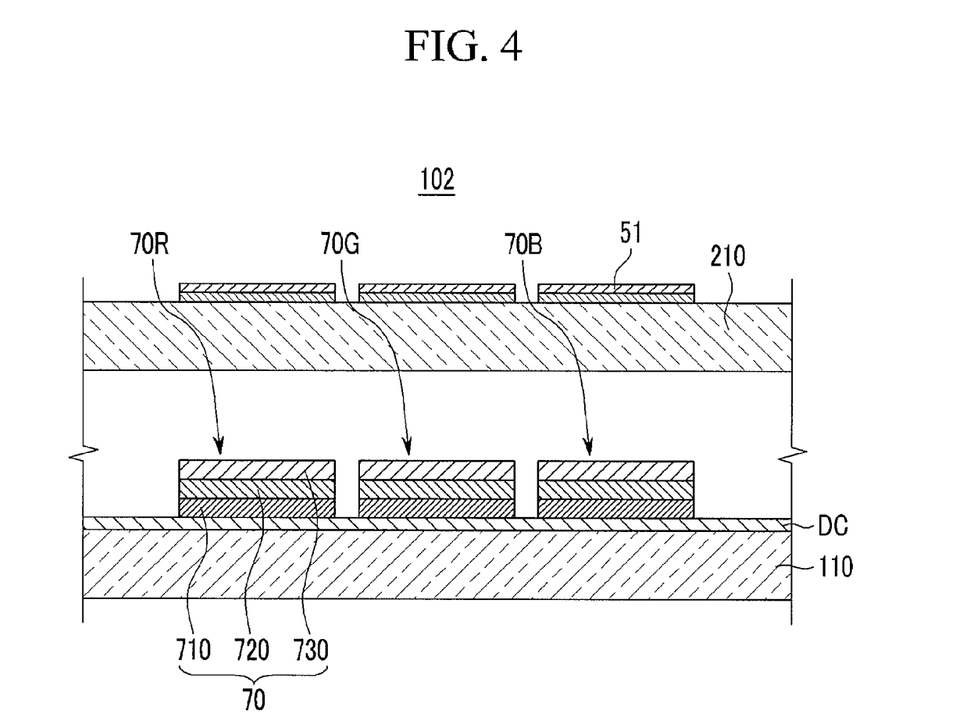
FIG. 4 is a cross-sectional view of red, green, and blue pixel portions of an OLED display according to a second exemplary embodiment.

FIG. 4 is a cross-sectional view of red, green, and blue pixel portions of an OLED display according to a second exemplary embodiment. In the OLED display 101 of the first exemplary embodiment, the translucent insulating layer filter 50 is formed on the inner surface of the encapsulation substrate 210. However, in the OLED display 102 according to the second exemplary embodiment, a translucent insulating layer filter 51 is formed on the outer surface of the encapsulation substrate 210.

In the OLED display 101 of the first exemplary embodiment, light reflected by the first electrode 710 or the second electrode 730 and emitted into the air layer 300 is amplified through the microcavity by being reflected at the interface of the air layer 300 and the translucent insulating layer filter 50, and the interface of the translucent insulating layer filter 50 and the encapsulation substrate 210.

However, in the OLED display 102 of the second exemplary embodiment, the light reflected by the first electrode 710 or the second electrode 730 and emitted into the air layer 300 is amplified through the microcavity by being reflected at the interface of the air layer 300 and the encapsulation substrate 210, and the interface of the encapsulation substrate 210 and the translucent insulating layer filter 51.

Figure 5:
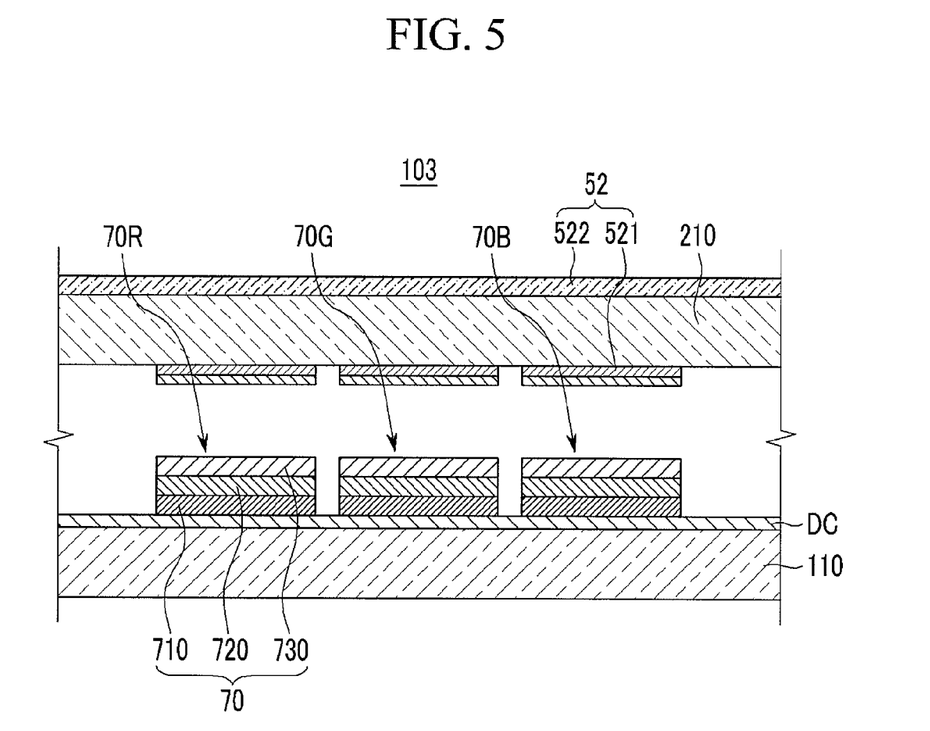
FIG. 5 is a cross-sectional view of red, green, and blue pixel portions of an OLED display according to a third exemplary embodiment.

FIG. 5 is a cross-sectional view of red, green, and blue pixel portions of an OLED display according to a third exemplary embodiment. Referring to FIG. 5, in the OLED display 103 of the third exemplary embodiment, a translucent insulating layer filter 52 includes a first translucent insulating layer filter 521 formed on the inner surface of the encapsulation substrate 210, and a second translucent insulating layer filter 522 formed on the outer surface of the encapsulation substrate 210. Alternatively, the translucent insulating layer filter may be formed solely on the outer surface of the encapsulation substrate, i.e., the OLED display has a structure similar to that depicted in FIG. 5 except that the first translucent insulating layer filter 521 is omitted.

The first translucent insulating layer filter 521 is formed with separate patterned portions corresponding to the red, the green, and the blue pixel portions 70R, 70G, and 70B of the organic light emitting element 70. The second translucent insulating layer filter 522 is integrally formed (i.e., a continuous layer) corresponding to the total of the red, the green, and the blue pixel portions 70R, 70G, and 70B. Accordingly, the second translucent insulating layer filter 522 may be more easily formed than the first translucent insulating layer filter 521 having the pattern. The translucent insulating layer filter 52 of the third exemplary embodiment may be formed by adding the second translucent insulating layer filter 522 to the translucent insulating layer filter 50 of the first exemplary embodiment.

In the OLED display 103 of the third exemplary embodiment, the light reflected by the first electrode 710 or the second electrode 730 and emitted into the air layer 300 is amplified through the microcavity by being reflected at the interface of the air layer 300 and the first translucent insulating layer filter 521, the interface of the first translucent insulating layer filter 521 and the encapsulation substrate 210, and the interface of the encapsulation substrate 210 and the second translucent insulating layer filter 522.

Figure 6:
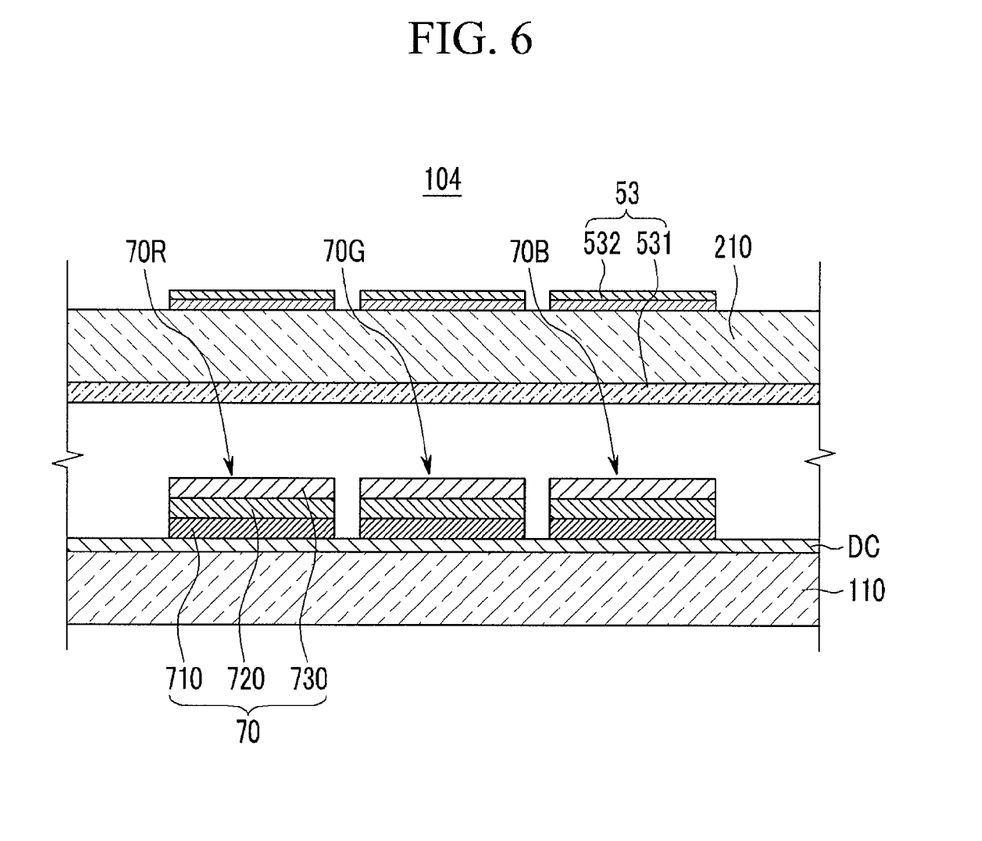
FIG. 6 is a cross-sectional view of red, green, and blue pixel portions of an OLED display according to a fourth exemplary embodiment.

FIG. 6 is a cross-sectional view of red, green, and blue pixel portions of an OLED display according to a fourth exemplary embodiment. In the OLED display 103 of the third exemplary embodiment, the translucent insulating layer filter 52 includes a first translucent insulating layer filter 521 with the independent pattern on the inner surface of the encapsulation substrate 210, and the second translucent insulating layer filter 522 that has been continuously formed on the outer surface. In the OLED display 104 of the fourth exemplary embodiment, the translucent insulating layer filter 53 includes a first translucent insulating layer filter 531 that is a continuous layer (i.e., it corresponds to the total of the red, green, and blue pixel portions) on the inner surface of the encapsulation substrate 210, and a second translucent insulating layer filter 532 having an independent pattern (individually corresponding to each of the red, green, and blue pixel portions) on the outer surface. Alternatively, the translucent insulating layer filter may be formed solely on the inner surface of the encapsulation substrate using a continuous translucent insulating layer filter, i.e., the OLED display has a structure similar to that depicted in FIG. 6 except that the second translucent insulating layer filter 532 is omitted.

In the OLED display 104 of the fourth exemplary embodiment, the light reflected by the first electrode 710 or the second electrode 730 and emitted into the air layer 300 is amplified through the microcavity by being reflected at the interface of the air layer 300 and the first translucent insulating layer filter 531, the interface of the first translucent insulating layer filter 531 and the encapsulation substrate 210, and the interface of the encapsulation substrate 210 and the second translucent insulating layer filter 532.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SOME REFERENCE NUMERALS 101, 102, 103, 104: OLED display
50, 51, 52, 53: translucent insulating layer filter
521, 531: first translucent insulating layer filter
522, 532: second translucent insulating layer filter
70: organic light emitting element
70R, 70G, 70B: red, green, and blue pixel portions
111: substrate main body
120: buffer layer
190: pixel definition layer
191: opening
210: encapsulation substrate
300: air layer
710: first electrode
730: second electrode
720: organic emission layer
DC: driving circuit

What is claimed is:

1. An organic light emitting diode (OLED) display comprising:
   a substrate main body;
   an organic light emitting element on the substrate main body;
   an encapsulation substrate covering the organic light emitting element and coupled to the substrate main body;
   a translucent insulating layer filter contacting the encapsulation substrate, the translucent insulating layer filter and the encapsulation substrate forming a microcavity; and
   an air layer between the organic light emitting element and the translucent insulating layer filter,
   wherein the organic light emitting element comprises a red pixel portion, a green pixel portion, and a blue pixel portion,
   wherein at least a portion of the translucent insulating layer filter overlaps each of the red, green, and blue pixel portions,
   wherein the translucent insulating layer filter comprises a same material for the red, the green, and the blue pixel portions, and
   wherein the translucent insulating layer filter comprises an organic insulating material selected from the group consisting of poly(3,4-ethylenedioxythiophene) (PEDOT); 4,4'-bis[N-(3-methylphenyl-N-phenyl amino)]biphenyl (TPD); 4,4',4"-tris[(3-methylphenyl)phenyl amino] triphenylamine (m-MTDATA); 1,3,5-tris [N,N-bis(2-methylphenyl-amino]-benzene (o-MTDAB); 1,3,5-tris [N,N-bis(3-methylphenyl-amino]-benzene (m-MTDAB); 1,3,5-tris[N,N-bis(4-methylphenyl)-amino]-benzene (p-MTDAB); 4,4'-bis[N,N-bis(3-methylphenyl)-amino]-diphenylmethane (BPPM); 4,4'-dicarbazolyl-1,1'-biphenyl (CBP); 4,4',4"-tris(N-carbazol)triphenylamine (TCTA); 2,2',2"-(1,3,5-benzentolyl)tris-1-[phenyl-1H-benzoimidazol](TPBI); and 3-(4-biphenyl)-4-phenyl-5-t-butylphenyl-1,2,4-triazole (TAZ).

2. The OLED display of claim 1, wherein the translucent insulating layer filter is on at least one of an inner surface of the encapsulation substrate facing the organic light emitting element, or an outer surface of the encapsulation substrate facing away from the organic light emitting element.

3. The OLED display of claim 2, wherein the translucent insulating layer filter comprises separate patterned portions corresponding to the red pixel portion, the green pixel portion, and the blue pixel portion.

4. The OLED display of claim 3, wherein the translucent insulating layer filter comprises a plurality of layers, and wherein a separate microcavity is present at each interface of adjacent layers.

5. The OLED display of claim 2, wherein the translucent insulating layer filter comprises a first translucent insulating layer filter on the inner surface of the encapsulation substrate, and a second translucent insulating layer filter on the outer surface of the encapsulation substrate.

6. The OLED display of claim 5, wherein:
   the first translucent insulating layer filter comprises separate patterned portions corresponding to the red pixel portion, the green pixel portion, and the blue pixel portion; and
   the second translucent insulating layer filter is a continuous layer corresponding to a total of the red pixel portion, the green pixel portion, and the blue pixel portion.

7. The OLED display of claim 6, wherein the first translucent insulating layer comprises a plurality of layers, and wherein a separate microcavity is present at each interface of adjacent layers.

8. The OLED display of claim 5, wherein:
the first translucent insulating layer filter is a continuous layer corresponding to a total of the red pixel portion, the green pixel portion, and the blue pixel portion; and
the second translucent insulating layer filter comprises separate patterned portions corresponding to the red pixel portion, the green pixel portion, and the blue pixel portion.

9. The OLED display of claim 8, wherein the second translucent insulating layer comprises a plurality of layers, and wherein a separate micro cavity is present at each interface of adjacent layers.

10. The OLED display of claim 1, wherein the translucent insulating layer filter comprises a plurality of layers, wherein at least one of the plurality of layers comprises the organic insulating material, and wherein at least another of the plurality of layers comprises a compound selected from the group consisting of silicon oxide, silicon nitride, and silicon oxy-nitride.

\* \* \* \* \*